United States Patent [19]

Hinshaw

[11] Patent Number: 4,890,196
[45] Date of Patent: Dec. 26, 1989

[54] SOLDERABLE HEAT SINK FASTENER

[75] Inventor: Howard G. Hinshaw, Dallas, Tex.

[73] Assignee: Thermalloy Incorporated, Dallas, Tex.

[21] Appl. No.: 130,309

[22] Filed: Dec. 9, 1987

Related U.S. Application Data

[63] Continuation of Ser. No. 842,988, Mar. 24, 1986, abandoned.

[51] Int. Cl.$^4$ ............................................. H05K 7/20
[52] U.S. Cl. ................................. 361/388; 361/386; 351/81
[58] Field of Search .................. 361/383–384, 361/386, 387, 388; 165/185; 174/16 HS; 357/81

[56] References Cited

U.S. PATENT DOCUMENTS

| | | | |
|---|---|---|---|
| 4,054,901 | 10/1977 | Edwards et al. | 174/16 HS X |
| 4,321,423 | 3/1982 | Johnson et al. | 361/386 X |
| 4,388,967 | 6/1983 | Breese | 361/386 X |
| 4,575,038 | 3/1986 | Moore | 361/383 X |
| 4,593,342 | 6/1986 | Lindsay | 357/81 X |
| 4,611,389 | 9/1986 | Blair et al. | 357/81 X |
| 4,652,971 | 3/1987 | Peterson et al. | 361/386 |

FOREIGN PATENT DOCUMENTS

| | | | |
|---|---|---|---|
| 3025964 | 2/1982 | Fed. Rep. of Germany | 357/81 |
| 0160642 | 8/1985 | Japan | 357/81 |

OTHER PUBLICATIONS

IBMTDB, vol. 24, No. 2, Buchta et al, 1981.

Primary Examiner—William M. Shoop, Jr.
Assistant Examiner—A. Jonathan Wysocki
Attorney, Agent, or Firm—Kanz, Scherback & Timmons

[57] ABSTRACT

Disclosed are solderable fastener devices for mounting heat sinks and electronic device packages on circuit boards. The fastener includes at least one mounting member extending to the circuit board and adapted for soldering thereto. The mounting member spaces the fastener, heat sink and electronic device package above the surface of the circuit board. The fastener further includes attachment means for gripping the heat sink and attaching it to the fastener. Securing means are provided for affixing the electronic device package to the heat sink and the fastener above the surface of the circuit board.

18 Claims, 2 Drawing Sheets

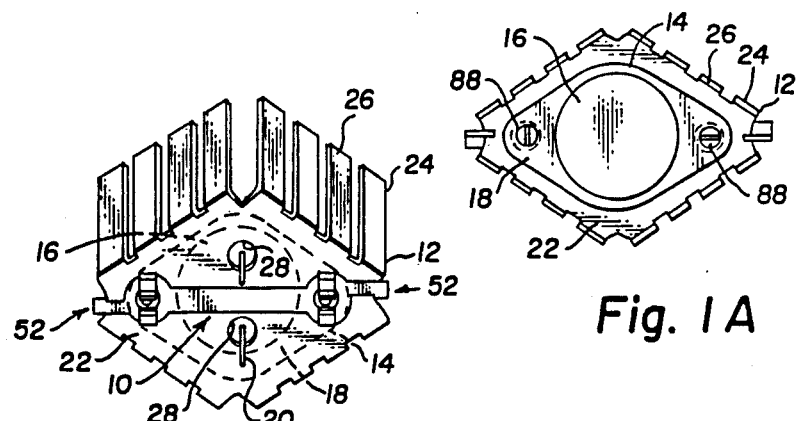
Fig. 1A
Fig. 1
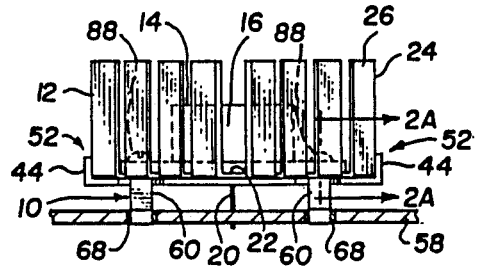
Fig. 2
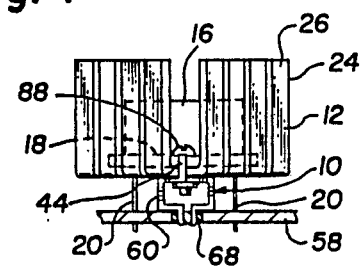
Fig. 3
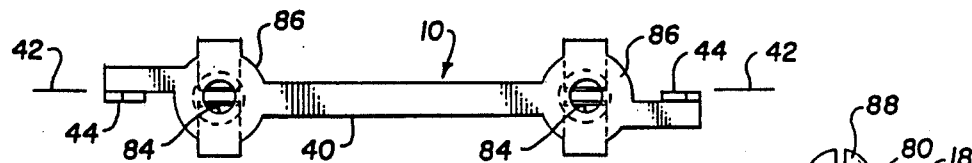
Fig. 4
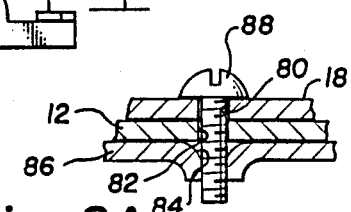
Fig. 2A
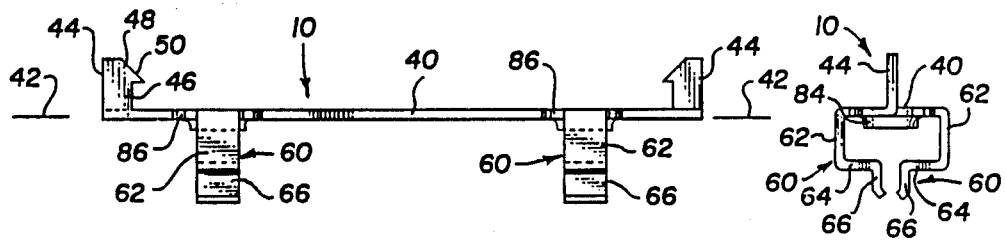
Fig. 5
Fig. 6

SOLDERABLE HEAT SINK FASTENER

This is a continuation of application Ser. No. 06/842,988 filed Mar. 24, 1986 now abandoned entitled Solderable Heat Sink Fastener.

This invention relates to fastening devices for heat sinks. More particularly, it relates to solderable fasteners for mounting heat sinks and the like on circuit boards.

All electronic devices such as transistors, resistors, diodes and the like produce heat as a by-product of transmission of electric current therethrough. This heat is then dissipated into the surrounding environment while the electronic device is in use. Heat sinks may be placed in contact with the electronic device packages to facilitate dissipation of heat. For the purposes of this application, a heat sink is any article adapted to transfer heat to the atmosphere at a high rate through radiation and/or convection. Generally, heat sinks are constructed from metals such as aluminum having high thermal conduction characteristics and are mounted on the printed circuit board, each in contact with one or more of the heat dissipating electronic device packages. Heat produced by the electronic device package is transferred into the heat sink by conduction and is rapidly dissipated by the heat sink to the atmosphere.

Frequently the heat sink is surface treated, such as by anodization, to protect the heat sink from corrosion and enhance the heat dissipating characteristics of the heat sink. However, the surface treatment makes it difficult to attach the heat sink directly to a circuit board by soldering. For this reason, and also due to the relatively large size and weight of heat sinks compared to other components soldered to the circuit board, heat sinks are commonly mechanically mounted on the printed circuit board and an electronic device package mounted on the heat sink in order to conserve surface area on the circuit board. Alternatively, the electronic device package is sometimes mounted directly on the circuit board and thermally connected to an adjacent heat sink.

Existing designs for mechanically mounting heat sinks on circuit boards utilize standoffs such as threaded studs, nuts having a threaded cavity, tabs or pins which are attachable to the heat sink and solderable into preformed holes in circuit boards. Usually two or more standoffs are required to mount the heat sink on the circuit board. In many instances, it is desirable to preassemble the standoffs on the heat sink prior on mounting on the circuit board. Alternatively, the standoffs may be soldered to the circuit board along with other components and then attached to the heat sink. In any case, the alignment of the heat sink with the multiple standoffs and with the circuit board is labor intensive and therefore costly, particularly when an electronic device package is mounted on a heat sink and the leads extending from the electronic device package must be simultaneously aligned with and inserted into holes in a circuit board. Also, conventional standoffs are expensive to manufacture compared to the overall cost of the heat sink.

In those applications where it is also desirable to secure an electronic device package to the heat sink, the electronic device package is sometimes provided with one or more mounting holes and a like number of mounting holes are formed on the heat sink on which the electronic device package is to be mounted. After the electronic device package is positioned on the heat sink and their respective mounting holes aligned, screws or the like are passed through each of the sets of aligned holes and secured by nuts. This process is likewise slow, labor intensive and therefore costly. The use of separate structures for mounting the heat sink on the circuit board and for securing an electronic device package to the heat sink is also inherently inefficient.

The present invention provides an improved fastener for mounting heat sinks on circuit boards or the like. In one embodiment the fastener includes a unitary elongated body. Means are provided to mount the fastener on a circuit board by simultaneously soldering the fastener to the circuit board at one or more locations. The mounting means of the fastener includes one or more downwardly extending mounting members adapted for insertion and soldering into aligned preformed holes in the circuit board.

The fastener body includes means for attaching the fastener to the heat sink. In one embodiment of the invention the attachment means comprises a pair of longitudinally spaced clips. The heat sink and fastener may be forced together with the clips engaging opposite ends of the heat sink. The attachment clips enable the heat sink and fastener to be preassembled to each other prior to mounting the fastener on the circuit board or, alternatively, the fastener may be mounted on the circuit board and the heat sink attached to the fastener by the attachment clips.

The fastener body may also include securing means for securing an electronic device package to the heat sink. The securing means may comprise one or more threaded apertures formed in the fastener body, each aligned with one set of the mounting holes on the heat sink and electronic device package. The apertures on the fastener are adapted to threadedly engage screws inserted through the aligned mounting holes to secure the electronic device package to the heat sink. In other embodiments of the invention multiple discrete fasteners are provided for mounting a heat sink on a circuit board, with or without an electronic device package secured thereto. These features and advantages of the invention as well as others which will become apparent to those skilled in the art will be more readily understood from the following detailed description taken in conjunction with the appended drawing which drawing forms a part of the specification and in which like numerals depict like parts in the several views. It is to be noted, however, that the appended drawing illustrates only preferred embodiments of the invention and is therefore not to be considered limiting of its scope, for the invention may admit to other equally effective embodiments.

FIG. 1 is a perspective view of a heat sink with a fastener according to this invention attached to an electronic device package.

FIG. 1A is a top view of the fastener, heat sink and electronic device package of FIG. 1.

FIG. 2 is a side view of the heat sink, fastener and electronic device package of FIG. 1 mounted on a circuit board.

FIG. 2A is a detailed cross-sectional view of the securing means of the fastener of FIG. 2.

FIG. 3 is an end view of the heat sink, electronic device package and fastener of FIG. 2.

FIG. 4 is a top view of the fastener of FIG. 1.

FIG. 5 is a side view of the fastener of FIG. 4.

FIG. 6 is an end view of the fastener of FIG. 4.

Figure 7:
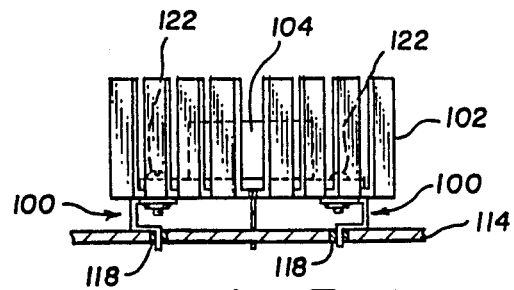
FIG. 7 is a side view of an alternative embodiment of the fastener of this invention attached to a heat sink and electronic device package and mounted on a circuit board.
Figure 8:
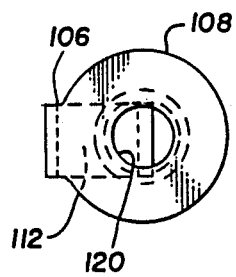
FIG. 8 is a top view of the fastener of FIG. 7.
Figure 9:
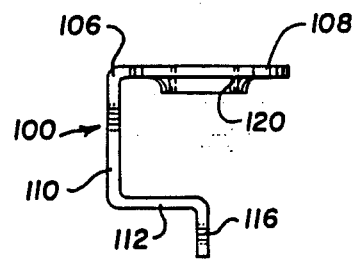
FIG. 9 is a side view of the fastener of FIG. 7.
Figure 10:
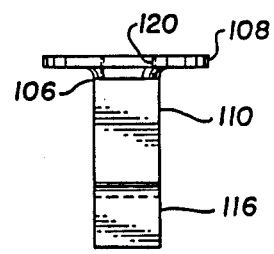
FIG. 10 is an end view of the fastener of FIG. 7.

Referring now to FIGS. 1 and 1A, the reference numeral 10 generally indicates a fastener constructed in accordance with the invention. The fastener is attached to heat sink 12 and secured to electronic device package 14. The electronic device package may consist of any type of device such as a transistor, resistor, diode or the like intended to be mounted on a circuit board or connected to a heat sink. In the illustrated embodiment the electronic device package takes the form of a TO3 transistor package. The electronic device package includes cylindrical enclosure 16 enclosing an electronic component (not shown) and a surrounding flange 18. The electronic device package further includes a pair of downwardly extending leads 20 for connecting the electronic component to an external circuit.

Heat sink 12 is constructed in a manner known to be effective in radiating and conveying heat to the environment and includes rhombus-shaped base 22 and four upwardly extending side plates 24. Each side plate includes a plurality of parallel spaced upright fingers 26. Of course, it is recognized that the heat sink may be constructed in any manner known in the art as suitable for use with the electronic device package. A pair of holes 28 are provided in the base of the heat sink in alignment with the leads 20 of the electronic device package to enable the leads to be connected to the circuit board (not shown).

Fastener 10 as shown in more detail in FIGS. 4–6 includes a unitary elongated body 40 defining longitudinal axis 42. The fastener may be formed by conventional metal forming techniques from suitable sheet or ribbon materials such as aluminum, copper and alloys thereof. The material should exhibit sufficient strength and resiliency to firmly support heat sink 12 and electronic device package 14 on the circuit board.

Means are provided to quickly and easily attach the fastener to the heat sink, preferably in a non-permanent manner so that, if desired, the heat sink may be quickly and easily removed from the fastener for repair or replacement. In the illustrated embodiment the attachment means takes the form of clips 44 formed at both ends of the elongated body along the longitudinal axis thereof. Each clip includes an upwardly projecting tab 46 and an inwardly extending tooth 48. Inclined, inwardly facing surface 50 is formed on the upper edge of the tooth.

As the fastener and the heat sink are pushed together, the inclined surfaces on the clips encounter the heat sink adjacent opposing corners thereof (as at 52) causing the clips to be deflected outwardly until the base of the heat sink passes the teeth of the clips and the clips resume their undeflected position to engage the base of the heat sink and secure the fastener to the heat sink. The heat sink may be removed by deflecting the attachment clips outwardly and pulling the heat sink away from the fastener.

As shown in FIGS. 2 and 3 means are also provided to mount the fastener on circuit board 58. In the illustrated embodiment the mounting means takes the form of two longitudinally spaced pairs of downwardly extending mounting members 60 on the fastener symmetrical about the longitudinal axis thereof. In the preferred embodiment of the invention each mounting member includes downwardly extending first member 62. The opposing first members each connect to transverse second members 64 directed inwardly toward the longitudinal axis of the body and terminate in downwardly extending third member 66. Each pair of opposing third members are adapted for insertion into an aligned preformed hole 68 in the circuit board and for soldering in place to secure the fastener and heat sink to the circuit board with the second member of each mounting member in contact with the surface of the circuit board. Although the mounting members are illustrated as being received in opposing pairs, this invention encompasses a fastener having one or more separate mounting members formed along the body. The mounting means of this invention also has the inherent property of spacing the heat sink and electronic device package above the surface of the circuit board by the length of the downwardly extending first members 62. Alternatively, the mounting member may be adapted for surface soldering onto preformed mounting pads on the circuit board in a manner known in the art and described in U.S. Pat. No. 644,038 entitled Fasteners for Surface Mounting of Printed Circuit Board Components. In such embodiments the third member of each of the mounting members is omitted and the second members soldered to mounting pads on the circuit board to mount the fastener thereto. Therefore, for purposes of this application, mounting the fastener on a circuit board encompasses not only soldering a mounting member into a hole in the circuit board but also surface mounting of the mounting member 60.

An important aspect of the present invention is that mounting member 60 readily accept a solder bond. To that end at least a portion of downwardly extending third member 66 of each mounting member is clad with a solderable material such as tin or a tin-lead alloy which promotes the formation of solder bonds. The pre-clad material may be applied by conventional pre-tinning, plating or the like. Such coatings are conventionally referred to as "pre-tin" regardless of the composition of the material or the process by which they are applied, and the terms "pre-tinned", "pre-tin", "tin-plated" and "tin-coated" are used interchangeably herein to refer to solderable or solder-promoting coatings regardless of the actual composition of the coating or the manner by which the coating is applied. Mounting member 60 may be pre-tinned after the unitary body is formed as described above or fastener 10 may be formed from pre-tinned blank stock. Fastener 10 may be formed by metal stamping using conventional spring steel and the stamped parts thereafter tin-plated.

As previously discussed, it is sometimes desirable to pre-mount an electronic device package on a heat sink rather than directly on the circuit board. For this purpose, and as shown in FIG. 2A, the electronic device package includes a pair of mounting holes 80 which, in the TO3 device package illustrated, are formed at either end of mounting member 18. Holes 82 in the heat sink are aligned with holes 80 in the electronic device package when positioned on the heat sink. The fastener includes means for securing the electronic device package to the heat sink in conjunction with the aligned mounting holes. Specifically, a pair of longitudinally spaced apertures 84 are formed in respective enlarged circular sections 86 in the elongated body of the fastener parallel with the bottom of the heat sink. The apertures are internally threaded so that bolts or screws 88 may be inserted through each aligned mounting hole in the electronic device package and the heat sink and threadedly secured in the apertures in the heat sink as shown in FIG. 2A. Although two sets of mounting holes and apertures are illustrated, it is within the spirit and scope of this invention to provide one or more apertures as required to secure the electronic device package to the heat sink. The mounting members are conveniently formed in pairs on the body adjacent the enlarged circular sections for increased support as the screws engage the apertures. However, the mounting members and apertures may be formed anywhere along the length of the body. Locating the mounting members on the outside edges of the enlarged circular sections also increases the length of the transverse second members thereof, thus improving the lateral stability of the fastener and of the heat sink when mounted on the circuit board.

The fastener of this invention combines the function of mounting a heat sink on a circuit board and securing an electronic device package to the heat sink. The fastener is economical to manufacture and replaces the multiple discrete standoffs of conventional designs. The fastener is easily attached to or removed from the heat sink without requiring extensive alignment procedures.

FIGS. 7–10 illustrate an alternate embodiment of the invention in which a separate fastener 100 is provided for each set of mounting holes (not shown) in heat sink 102 and electronic device package 104. As is shown in detail in FIGS. 8–10 each fastener 100 includes a unitary body 106 (formed as body 40 in FIGS. 4–6) having a circular section 108 parallel with the bottom of the heat sink. Upright first member 110 depends downwardly from the circular section and is designed to space the heat sink and the electronic device package above the surface of the circuit board. Second member 112 extends from the first member parallel with the surface of circuit board 114 and third member 116 extends downwardly from the second member. Third member 116 is adapted for insertion into and soldering in preformed hole 118 in the circuit board. The third member 116 of the fastener may include a solder-promoting coating such as is discussed herein with respect to the embodiment of FIGS. 4–6.

Aperture 120 formed in the circular section is internally threaded. A pair of fasteners 100 are soldered into preformed holes 118 on the circuit board. A heat sink is positioned over the fasteners and electronic device package is positioned on top of the heat sink with their respective mounting holes aligned. Screws 122 are inserted through the mounting holes of the heat sink and the electronic device package and each threadedly engaged with one of the apertures of the fasteners as shown in FIG. 2A. Alternatively, the fasteners may be attached to the heat sink and electronic device packages by the screws prior to soldering the fasteners on the circuit board. In either alternative the securing means for mounting the electronic circuit package to the heat sink and the attachment means for attaching the heat sink to the fastener are identical. If the electronic device package is mounted directly on the circuit board the screws are used solely for attaching the heat sink to the fastener.

FIGS. 11–14 illustrate another alternative embodiment of the fastener of this invention in which a separate fastener is provided for each set of mounting holes in the heat sink and the electronic device package. As in the embodiment shown in FIGS. 1–3 and 7 electronic device package 132 is secured to heat sink 134 and both are mounted on circuit board 136 by a pair of fasteners 130. As is shown in detail in FIGS. 12–14 each fastener includes a unitary body 138 (formed as body 40 in FIGS. 1–3) having generally rectangular section 140 parallel with the bottom of the heat sink. Upright first member 142 depends downwardly from the rectangular section and is designed to space the heat sink and the electronic device package above the surface of circuit board 158. Second member 144 extends from the first member parallel with the surface of the circuit board. Third member 146 extends downwardly from the second member and is adapted for insertion into and soldering in preformed hole 148 in the circuit board. Third member 146 may include a solder-promoting coating as previously discussed herein with respect to FIGS. 4–6 and 8–10. However, additional laterally spaced support members 150a and 150b are formed on either side of the downwardly depending first member. Each of these support members are of the same length as the second member and are adapted to contact the surface of the circuit board at points spaced laterally from the point at which the second member contacts the circuit board. The combination of the second member and the support elements increases the stability of the fastener in supporting the heat sink and the electronic device package on the circuit board.

Figure 11:
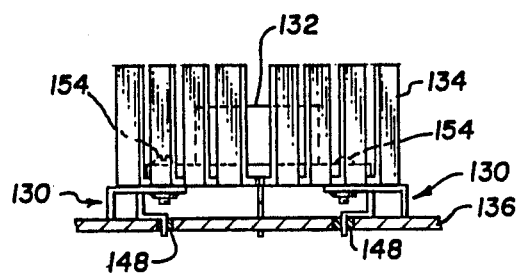
FIG. 11 is a side view of another alternative embodiment of the fastener of this invention attached to a heat sink and electronic device package and mounted on a circuit board.
Figure 12:
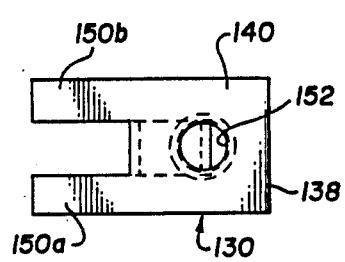
FIG. 12 is a top view of the fastener of FIG. 11.
Figure 13:
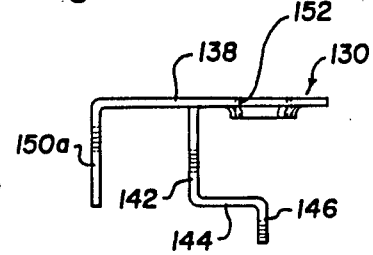
FIG. 13 is a side view of the fastener of FIG. 11.
Figure 14:
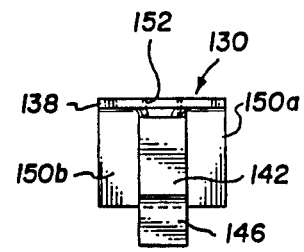
FIG. 14 is an end view of the fastener of FIG. 11.

Aperture 152 is formed in the first member and is internally threaded. As is shown in FIG. 11 a pair of the fasteners are soldered into holes on the circuit board. Heat sink 134 is positioned over the fasteners and electronic device package 132 is positioned on top of the heat sink with their respective mounting holes aligned. Screws 154 are inserted through the mounting holes of the heat sink and the electronic device package and threadedly engaged with each of the apertures of the fasteners as is shown in FIG. 2A. Alternatively, the fastener may be soldered to the circuit board and the heat sink and the electronic device package subsequently secured to the fasteners by screws as described above. If the electronic device package is mounted directly on the circuit board the screws are used solely for attaching the heat sink to the fastener.

Although the invention has been described above with regard to particular and preferred embodiments, these are advanced for illustrative purposes only and are not intended to limit the scope of this invention. In applications in which the electronic device package is to be separately mounted on the circuit board, the threaded apertures in the body of the fastener may be omitted and the heat sink attached by the attachment clips described herein. The clips may be omitted and the threaded apertures included for use in attaching the heat sink to the fastener with the screws. Although not illustrated, it is sometimes desirable to insert an electrically insulating material between the fastener and the heat sink to insulate the heat sink from the circuit board. Similarly, thermally conductive material may be interposed between the heat sink and the electronic device package to ensure effective heat transfer therebetween.

Such variations are all included within the spirit and scope of the invention as defined by the appended claims.

What is claimed is:

1. Apparatus for mounting a heat sink and an electronic device package on a circuit board comprising:
   (a) a substantially flat unitary body having a first face lying in a first plane and a second oppositely disposed face lying in a second plane and at least one aperture therein adapted for alignment with an aperture in a heat sink positioned adjacent said first face and adapted for attachment to said heat sink by screw means passing through both said apertures; and
   (b) solderable attachment means depending from said body in the direction substantially perpendicular to and opposite said first face and adapted to attach said body to a circuit board with said second face spaced from and substantially parallel with a surface of said circuit board.

2. Apparatus as defined in claim 1 wherein said aperture in said body is adapted to threadedly engage screw means passing through both said apertures.

3. Apparatus as defined in claim 1 wherein said solderable attachment means comprises an elongated member having a first segment extending in a first direction substantially normal to said second face and a second segment extending in a second direction substantially parallel with and spaced from said second face.

4. Apparatus as defined in claim 1 wherein said solderable attachment means comprises an elongated member having a first segment extending in a first direction substantially normal to said second face, a second segment extending in a second direction substantially parallel with and spaced from said second face, and a third segment extending from said second segment in said first direction.

5. Apparatus as defined in claim 4 wherein said third segment is aligned substantially coaxially with said at least one aperture.

6. Apparatus as defined in claim 1 wherein at least the end portion of said solderable attachment means remote from said body carries a solder-promoting material thereon.

7. Apparatus as defined in claim 1 including spacer means depending from said body substantially parallel with said attachment means adapted to contact the surface of the circuit board and thereby space said second face from the surface of the circuit board.

8. Apparatus as defined in claim 1 wherein said solderable attachment means comprises a pair of elongated members, each elongated member having a first segment extending in a first direction substantially normal to said second face, a second segment extending in a direction substantially parallel with said second face and toward the opposite member of said pair, and a third segment extending from said second segment in said first direction.

9. Apparatus as defined in claim 8 wherein said pair of elongated members depend from said second face of said body on opposite sides of said at least one aperture.

10. Apparatus for mounting a heat sink on but spaced from the surface of a circuit board comprising:
    (a) a unitary elongated body having a first face and an oppositely disposed second face;
    (b) at least two resilient clip members extending in a first direction from said first face adapted to grippingly engage a heat sink positioned adjacent said first face; and
    (c) solderable attachment means depending from said body in the direction opposite said first direction and adapted to attach said body to a circuit board and support said second face and said heat sink spaced from and substantially parallel with a surface of said circuit board.

11. Apparatus as defined in claim 10 wherein said elongated unitary body has at least one aperture therein extending from said first face to said second face and adapted to be aligned in register with an aperture in a heat sink positioned adjacent said first face.

12. Apparatus as defined in claim 10 wherein said solderable attachment means comprises a pair of elongated members, each elongated member having a first segment extending in a direction opposite said first direction, a second segment extending in a direction substantially parallel with said second face and toward the opposite member of said pair, and a third segment extending from said second segment in the direction opposite said first direction.

13. Apparatus as defined in claim 11 wherein said solderable attachment means comprises a pair of elongated members, each elongated member having a first segment extending in a direction opposite said first direction, a second segment extending in a direction substantially parallel with said second face and toward the opposite member of said pair, and a third segment extending from said second segment in the direction opposite said first direction.

14. Apparatus as defined in claim 13 wherein said pair of elongated members depend from the second face of said elongated body on opposite sides of said at least one aperture.

15. The combination comprising:
    (a) an electronic device case with a base having an aperture therein;
    (b) a heat sink having a base with an aperture therein aligned with the aperture in said device case;
    (c) a circuit board;
    (d) unitary apparatus attaching said device case and said heat sink to said circuit board comprising:
        (i) a substantially flat body having a first face adjacent said heat sink base, a second face and an aperture therein aligned with the apertures in said device case and said heat sink; and
        (ii) attachment means depending from said second face soldered to said circuit board and supporting said second face substantially parallel with and spaced from the surface of said circuit board; and
    (e) screw means extending through the aperture in said device case and the aperture in said heat sink and threadedly engaging the aperture in said body of said unitary apparatus.

16. The combination comprising:
    (a) a heat sink;
    (b) a circuit board; and
    (c) unitary apparatus attaching said heat sink to said circuit board comprising:
        (i) substantially flat elongated body having a first and second oppositely disposed major faces with said first face adjacent said heat sink base;
        (ii) attachment means depending from said second face soldered to said circuit board and supporting said second face substantially parallel with and spaced from the surface of said circuit board; and (iii) at least two resilient clips extending from said first face and grippingly engaging said heat sink.

17. The combination defined in claim 16 including:
    (a) an electronic device case having a mounting flange with an aperture therein;
    (b) an aperture in said heat sink and an aperture in said unitary apparatus aligned coaxially with the aperture in said device case; and
    (c) screw means passing through said apertures and threadedly engaging the aperture in said attachment means.

18. The combination comprising:
    (a) a heat sink having a base with an aperture therein;
    (b) a circuit board;
    (c) unitary apparatus attaching said heat sink to said circuit board comprising:
        (i) a substantially flat body having a first face adjacent said heat sink base, a second face and an aperture therein aligned with the aperture in said heat sink; and
        (ii) attachment means depending from said second face soldered to said circuit board and supporting said second face substantially parallel with and spaced from the surface of said circuit board; and
    (d) screw means extending through said aperture in said heat sink and threadedly engaging the aperture in said body of said unitary apparatus.

* * * * *

UNITED STATES PATENT AND TRADEMARK OFFICE
CERTIFICATE OF CORRECTION

PATENT NO. : 4,890,196

DATED : December 26, 1989

INVENTOR(S) : Howard G. Hinshaw

It is certified that error appears in the above-identified patent and that said Letters Patent is hereby corrected as shown below:

Column 8, line 63, between "(i)" and "substantially"
    insert ---a---

Column 8, line 63, change "having a first" to ---having first---

Signed and Sealed this

Twenty-seventh Day of November, 1990

Attest:

HARRY F. MANBECK, JR.

*Attesting Officer*      *Commissioner of Patents and Trademarks*